United States Patent [19]

Sohn

[11] Patent Number: 5,708,430

[45] Date of Patent: Jan. 13, 1998

[54] HIGH SPEED VARIABLE LENGTH CODE DECODING APPARATUS

[75] Inventor: Young-Seok Sohn, Seoul, Rep. of Korea

[73] Assignee: Daewoo Electronics Co., Ltd., Seoul

[21] Appl. No.: 616,941

[22] Filed: Mar. 18, 1996

[30] Foreign Application Priority Data

Mar. 16, 1995 [KR] Rep. of Korea ............... 95-5426

[51] Int. Cl.[6] .................................................. H03M 7/40
[52] U.S. Cl. ........................... 341/67; 341/65; 341/106; 341/107
[58] Field of Search .......................... 341/65, 67, 106, 341/107

[56] References Cited

U.S. PATENT DOCUMENTS

| | | | |
|---|---|---|---|
| 5,181,031 | 1/1993 | Tong et al. | 341/65 |
| 5,254,991 | 10/1993 | Ruetz et al. | 341/65 |
| 5,398,027 | 3/1995 | Ooi | 341/67 |
| 5,502,493 | 3/1996 | Meyer | 348/426 |
| 5,557,271 | 9/1996 | Rim et al. | 341/67 |
| 5,598,155 | 1/1997 | Ahn et al. | 341/67 |
| 5,600,812 | 2/1997 | Park | 395/410 |
| 5,604,498 | 2/1997 | Park | 341/65 |

*Primary Examiner*—Jeffrey A. Gaffin
*Assistant Examiner*—Jason L. W. Kost
*Attorney, Agent, or Firm*—Anderson Kill & Olick P.C.

[57] ABSTRACT

A variable-length code decoding apparatus for decoding sequential variable-length codewords includes a first barrel shifter for producing a first window output sequence in response to a window control signal, a second barrel shifter for producing a second window output sequence and a code value in response to a decoded codeword length, a relay circuit for latching the second window output sequence for one-half the clock cycle and providing the latched second window output sequence as a decoding output sequence, a first look-up table memory for producing the decoded codeword length in response to a pre_fix code of the variable-length codeword that begins at the first bit position of the decoding output sequence, a second look-up table memory for producing a fixed-length word in response to the decoded codeword length and the code value, and an accumulation block for producing the window control signal.

1 Claim, 3 Drawing Sheets

INPUT BIT STREAM

FIG. 3

| | LEAD111 | LATCH101 | LATCH102 | LEAD117 | LEAD119 | DECODING OUTPUT SEQUENCE | DECODED WORD | CODE VALUE | READ | CARRY | CODEWORD LENGTH |
|---|---|---|---|---|---|---|---|---|---|---|---|
| | | //// //// //// | //// //// //// | //// //// | //// //// | | | 111 | X | 1 | 8 |
| 1F | AaBbbCcc cDDddEE | //// //// //// | //// //// //// | //// //// | //// //// | //// //// | | 111 | X | 1 | 8 |
| 2R | AaBbbCcc cDDddEE | AaBbbCcc cDDddEE | //// //// //// | //// //// | AaBbbCcc | //// //// | | 111 | X | 1 | 8 |
| 3F | EeeeFFFF fffGGGGG | AaBbbCcc cDDddEE | //// //// //// | cDDddEE | BbbCcccD | | AaBbbCcc1Aa | | A' | 1 | 2 |
| 4R | gggHHHHH hhhIiiii | EeeeFFFF fffGGGGG | AgBbbCcc cDDddEE | DdddEEEe | CcccDDdd | | BbbCcccDBbb | | B' | 1 | 3 |
| 5F | gggHHHHH hhhIiiii | EeeeFFFF fffGGGGG | AaBbbCcc cDDddEE | dEEEeeeF | DDddEEE | | CcccDDddccc | | C' | 1 | 4 |
| 6R | gggHHHHH hhhIiiii | EeeeFFFF fffGGGGG | AaBbbCcc cDDddEE | eeeFFFFf | EEEeeFF | | DDddEEEddd | | D' | 0 | 5 |
| 7F | gggHHHHH hhhIiiii | EeeeFFFF fffGGGGG | AaBbbCcc cDDddEE | FFFffGGG | FFFFfffG | | EEEeeeFFeee | | E' | 0 | 6 |
| | | EeeeFFFF fffGGGG | EeeeFFFF fffGGGGG | GGGgggH | GGGGgggG | | FFFFfffGGGGGgggH | | fff | F' | 1 | 0 | 7 |

HIGH SPEED VARIABLE LENGTH CODE DECODING APPARATUS

FIELD OF THE INVENTION

The present invention relates to a variable length code (VLC) decoding apparatus; and, more particularly, to an improved VLC decoding apparatus which is capable of providing a high speed decoding operation by decoding two codewords for each clock cycle.

DESCRIPTION OF THE PRIOR ART

Variable length coding is a technique often used for lossless data compression. This technique is used to convert fixed-length data to variable-length codewords based on the statistical occurrences of the data. The codeword lengths are chosen in such a manner that shorter codewords are used to represent more frequently occurring data and longer codewords are selected to represent less frequently occurring data. By properly assigning the variable-length codewords to a library of all possible source codewords, the average word length of the variable-length codewords becomes shorter than that of the original data, thereby rendering it possible to achieve data compression.

In this connection, Huffman code design is a procedure commonly used to construct a minimum redundant variable length code for known data statistics. In general, the encoding process can be implemented by a table-lookup process using input data to address the table. The codewords and the word-length information are stored as contents of the table and outputted sequentially through the use of a buffer at a constant data rate onto the data channel.

At the receiving end of the encoded or compressed data, however, the decoding process may become more complicated. Owing to the varying length, each codeword has to be segmented from the received bit string before it can be decoded into a source symbol. Therefore, the design of a variable length decoder is more difficult than that of a variable length encoder.

There are several known apparatus for use to decode a stream of variable length codewords. Among them, most often used is a VLC decoder employing a tree-searching algorithm such as the one disclosed in U.S. Pat. No. 4,899,149 issued on Feb. 6, 1990 to Gary Kahan. In this device, a variable length code is represented by a tree with codewords as leaves(also called terminal nodes). The decoding process starts from the root of the code tree and is guided by the received bit stream to follow one of two branches at each node. When a leaf is reached, the end of a codeword is detected and is segmented from the remaining bit stream. This type of decoding apparatus includes a logic circuitry corresponding to the tree and a control circuitry to traverse the code tree. This approach may be slow, however, especially for long codewords, since a bit-by-bit search through the code tree is required for each decoded symbol.

A lookup-table based VLC decoder is disclosed in U.S. Pat. No. 5,173,695 issued on Dec. 22, 1992 to Ming-Ting Sun, et al.; and U.S. Pat. No. 5,245,338 to Ming-Ting Sun. That decoder includes two cascaded latch circuits, each having a bit capability equal to the maximum codeword length, which store consecutive bits supplied from an input buffer memory for storing the stream to be decoded in fixed-length data segments; a barrel shifter connected to the two latch circuits for providing a sliding decoding window output equal in length to the maximum codeword length; an accumulator which accumulates, modulo the maximum codeword length, the lengths of sequentially decoded variable length codewords; and a lookup-table memory device for outputting a fixed-length word corresponding to a variable-length codeword contained in the sliding decoding window output and for outputting a length of the variable-length codeword. As a codeword is decoded during each clock cycle, its length is accumulated and the decoding window of the barrel shifter is shifted to begin with the first bit of the next codeword to be decoded. When, during a clock cycle, the accumulated length exceeds the maximum codeword length, which would indicate that all the bits in the second latch circuit have been decoded, the bits in the first latch circuit are transferred into the second latch circuit and the next fixed-data segment of bits is read into the first latch circuit from the input buffer memory.

In the afore-described decoder structure, the operational speed is limited by the operational delay of the components in a critical path that includes the lookup-table memory, the barrel shifter, and the accumulator. And, its operational speed is further hampered by its limited ability to decode only one codeword for each clock cycle.

SUMMARY OF THE INVENTION

It is, therefore, a primary object of the invention to provide a VLC decoding apparatus, which is capable of decoding two codewords for each clock cycle by using both falling and rising edges of a clock cycle, thereby enhancing the speed of operation thereof.

In accordance with the present invention, a VLC decoding apparatus for decoding, at a half clock rate, sequential variable-length codewords supplied from an input buffer which stores an input bit stream to be decoded in fixed-length segments having a length equal to twice a longest length of the variable-length codewords, the apparatus comprising: a first and a second latch circuits for storing consecutive fixed-length segments of the input bit stream in the input buffer; a first barrel shifter connected to the first and the second latch circuits and having a first output window for producing a first window output sequence from bits in the consecutive fixed-length segments from the first and the second latch circuits, the bit length of the first window output sequence being equal to the longest length of the variable-length codewords and the first output window being shifted across the bits in the first and the second latch circuits in direct response to a window control signal; a second barrel shifter connected to the first barrel shifter and having a second output window for producing a second window output sequence from bits contained in the first window output sequence and a previous decoding output sequence applied thereto, and generating high-order M bits from the first bit in the second window output sequence as a code value, the bit length of the second window output being equal to the longest length of the variable-length codewords, the second output window being shifted in direct response to a codeword length and M being an integer smaller than the longest length of the variable-length codewords; a relay circuit for latching the second window output sequence for one-half the clock cycle and producing the latched second window output sequence as the decoding output sequence; a first memory coupled to the relay circuit for producing a codeword length in response to a pre_fix code which consists of high-order P bits of the variable-length codeword that begins at the first bit position of the decoding output sequence, the maximum value of P being an integer smaller than the longest length of the variable-length codewords; a second memory connected to the first memory and the second barrel shifter for producing a fixed-length word in response to the codeword length and the code value; an accumulation block for adding the codeword length to a previously accumulated codeword length in order to produce the window control signal indicating the added and accumulated codeword length, the accumulation block generating a read signal to retrieve a next fixed-length segment stored in the input buffer when the accumulated codeword length is greater than twice the longest length of the variable-length codewords, the next fixed-length segment being stored in the first latch circuit and the fixed-length segment previously stored in the first latch circuit being transferred to the second latch circuit.

BRIEF DESCRIPTION OF THE DRAWINGS

The above and other objects and features of the instant invention will become apparent from the following description of preferred embodiments taken in conjunction with the accompanying drawings, in which:

FIG. 3 provides an explanatory diagram for illustrating the operation of the VLC decoding apparatus shown in FIG. 1.

DETAILED DESCRIPTION OF THE PREFERRED EMBODIMENTS

Figure 1:
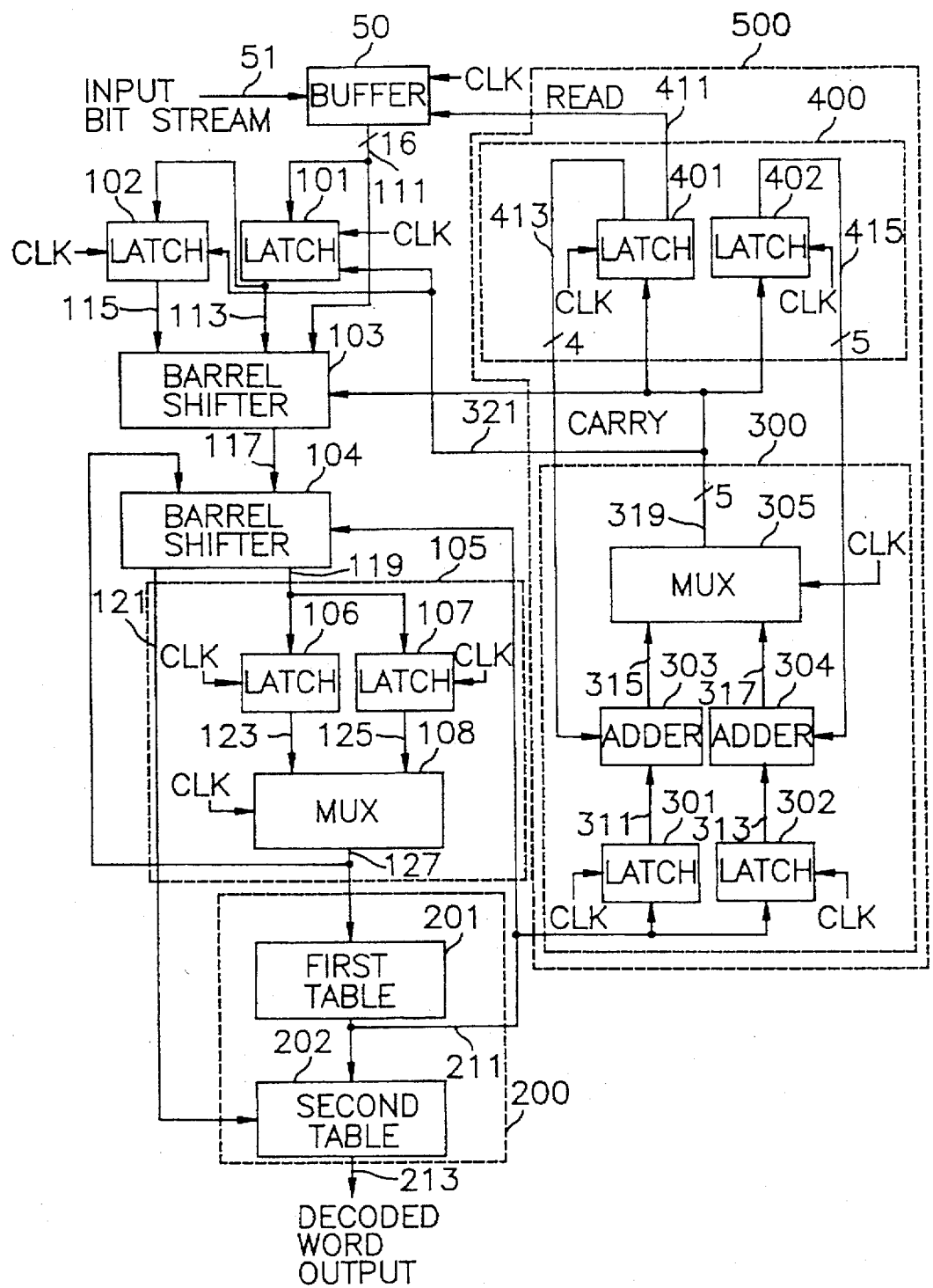
FIG. 1 shows a schematic diagram of a VLC decoding apparatus in accordance with the present invention.

Referring to FIG. 1, there is shown a block diagram of a VLC decoder in accordance with a preferred embodiment of the invention. For illustrative purposes, it is assumed that the maximum length of variable-length codewords to be decoded is 8 bits. The VLC decoder decodes successive variable-length codewords inputted thereto in a continuous bit stream and outputs decoded fixed-length codewords corresponding thereto, at a fixed symbol clock, on a lead 213.

A serial data stream received on a data channel 51 is inputted to an input buffer memory 50 which stores, in fixed-length data segments, the serial data stream of variable-length codewords and sequentially outputs the fixed-length data segments, e.g., 16-bit segments on a lead 111 at a clock tick, e.g., a rising clock tick of a clock signal CLK in response to a READ signal on a lead 411, wherein the bit length of the data segment is twice of the maximum bit length of the variable-length codewords and the clock signal has two types of clock tick, one of falling edge and the other of rising edge.

A latch circuit 101 is connected to the input buffer memory 50 and sequentially receives the fixed-length data segments on the lead 111 from the buffer memory 50. A latch circuit 102 is connected to the latch circuit 101 and receives the fixed-length data segment previously held in the latch circuit 101. The latch circuits 101 and 102 are controlled latches which latch-in the data at their inputs at a clock tick of the CLK only when a CARRY signal is present at their control inputs, wherein the latched data are retained at their outputs until the next clock tick of the CLK. In a preferred embodiment of the invention, the input buffer memory 50, and the latch circuits 101 and 102 operate at a different type of clock tick of the clock signal. As will be described, the latch circuits 101 and 102 read-in the data at their inputs, e.g., at a falling clock tick of the CLK, when an accumulation block 500 generates a CARRY signal on a lead 321. When a new data segment needs to be supplied, a READ signal is activated on the lead 411. When the READ signal on the lead 411 is activated, a next data segment is retrieved from the buffer memory 50 onto the lead 111 at a rising clock tick of the CLK. In response to a CARRY signal, and at the next falling clock tick of the CLK, the latch circuit 101 latches the next data segment on the lead 111, the data segment previously held in the latch circuit 101 is latched into the latch circuit 102. The latch circuit 102 thus always contains the data segment which is sequentially earlier in time than the data segment contained in the latch circuit 101.

The data segments of the latch circuits 102 and 101, and the output of the input buffer memory 50 on the lead 111, are inputted to a first barrel shifter 103, which has a consecutive 48-bits of the data stream supplied to its inputs. The first barrel shifter 103 has an 8-bit slidable output window across the 48 bits input to it, wherein the position of the output window is controlled by a window control signal indicating accumulated codeword lengths supplied through a lead 319 from the accumulation block 500. When the window control signal is activated on the lead 319, the 8-bit output window of the first barrel shifter 103 is directly shifted to include in it a next 8-bit sequence of the data segments in the first barrel shifter 103 as indicated by the window control signal. When the CARRY signal on the lead 321, which is activated when the first 16 bits of the data stream in the first barrel shifter 103 have been read-out to a second barrel shifter 104, is activated, the previous data segment in the latch circuit 101 is latched into the latch circuit 102 as a twice previous data segment and the current data segment on the lead 111 is latched into the latch circuit 101 as the previous data segment, in response to a clock tick of the falling edge. And, at a next clock tick of the rising edge, the next 16-bit data segment is retrieved from the input buffer memory 50 to appear at input bit position 33–48 of the first barrel shifter 103 as a current data segment. The output from the first barrel shifter 103, i.e., the first window output sequence, is an 8-bit sequence from the 48 bits data stream of the three input data segments, i.e., the twice previous data segment and the previous data segment outputted from the latch circuits 102 and 101, and the current data segment outputted from the buffer memory 50; and is supplied to the 16-bit input second barrel shifter 104 over a lead 117. The second barrel shifter 104 also receives an 8-bit decoding output sequence produced at the previous clock tick through a lead 127 in order to produce a next output sequence.

The second barrel shifter 104, which has an 8-bit slidable output window across the 16-bits input thereto and is controlled by a codeword length supplied through a lead 211 from a memory device 200, serves to output a second window output sequence to a lead 119 by using its slidable output window, which slides to a new position determined by the codeword length on the lead 211; and to simultaneously produces a code value of M, e.g., 3 bits to the memory device 200 through a lead 121, M being an integer smaller than the maximum length of the variable-length codeword. In a preferred embodiment of the invention, a 3-bit sequence in the 16-bit input data is defined as the code value, wherein the 3-bit sequence is left-positioned from the first bit in the second window output sequence. If the number of bits left-positioned from the first bit in the second window output sequence is less than 3, the second barrel shifter 104 generates the code value of 3-bit sequence by adding 1's as high-order bits of the 3-bit sequence. The second window output sequence from the second barrel shifter 104 is provided to a relay circuit 105 comprising two latch circuits 106 and 107, and a multiplexer(MUX) 108. The relay circuit 105 latches; the second window output sequence for one-half clock duration time and provides the latched second window output sequence over the lead 127 to the memory device 200 as a decoding output sequence. More specifically, the second window output sequence on the lead 119 produced at a clock tick from the second barrel shifter 104 is latched in the latch circuit 106 or 107 in the relay circuit 105 at a next clock tick. The latch circuits 106 and 107 latch-in the data at their inputs at a different clock tick type of the clock signal, e.g., at the falling and rising clock ticks of the CLK, respectively. The MUX 108 in the relay circuit 105 provides the second window output sequence as the decoding output sequence over the lead 127 to the memory device 200 and to the second barrel shifter 104 alternately from the latch circuit 106 in response to the falling clock tick and from 107 in response to the rising clock tick.

The memory device 200, which is coupled to the relay circuit 105, serves to produce a fixed-length word and a codeword length corresponding to a variable-length codeword that begins at the first bit position of the decoding output sequence. In a preferred embodiment of the invention, the memory device 200 includes first and second look-up tables 201 and 202, each of which may be implemented by a programmable logic array(PLA). The first look-up table 201 is employed for pre_fix decoding to produce a codeword length, while the second look-up table 202 is employed for sub_fix decoding to produce a decoded word. The first look-up table 201 comprises a pre_fix code table and a decoded word length table. A pre_fix code for each of the variable-length codewords is represented as an entry in the pre_fix code table, wherein each of the pre_fix codes consists of high-order P bits of each codeword, the high-order P bits being capable of indicating the length of each codeword and the maximum value of P being an integer smaller than the maximum length of the variable-length codeword, i.e., 8. Each table entry in the pre_fix code table has a length of 8 bits, and begins with an actual pre_fix code of variable, i.e., from 1 to P, e.g., 5 bits, length. Since pre_fix codes in a code library, which has the maximum length of 5 bits, have fewer than 8 bits, the bit positions in the table entry following the actual pre_fix code are designated as "don't care" positions. The length of a codeword is detected when a sequence from the MUX 108 in the relay circuit matches one of the bit patterns stored in the pre_fix code table. Thus, for example, if one of the bit patterns of a pre_fix code in the pre_fix code table is "11", its 8-bit table entry will be "11XXXXXX", where each "X" represents a "don't care". If the 8-bit sequence from the MUX 108 has a pattern "1101 1010", then a match occurs on the first two bits. When the decoding output sequence on the lead 127 matches an entry in the pre_fix code table, the corresponding entry in the decoded word length table is activated. The decoded word length table outputs on the lead 211 the codeword length corresponding to the matched pre_fix code of the variable-length codeword in the pre_fix code table. This codeword length supplied to the second barrel shifter 104 via the lead 211, at a next clock ticket is used to control the shift of the slidable output window of the second barrel shifter 104, and is inputted into the second look-up table 202. The second look-up table 202 comprising a sub_fix code table, a codeword length table and a decoded word table, also receives the code value on the lead 121 from the second barrel shifter 104. The codeword length for each variable-length codeword is represented as an entry in the codeword length table; and a sub_fix code for each of the variable-length codewords is represented as an entry in the sub_fix code table, wherein each of the sub_fix codes consists of low-order Q bits of each codeword, the value of Q being equal to the value that subtracts P from the maximum length of the variable-length codewords. Each table entry in the sub_fix code table has a length of 3 bits, and ends with an actual sub_fix code of variable, i.e., from 1 to Q bits, length. In case the actual sub_fix code has a length smaller than 3 bits, the bit positions in the table entry preceding the actual sub_fix code are designated as "don't care" positions. In the preferred embodiment of the invention, a variable-length codeword consists of the P-bits pre_fix code and the Q-bits sub_fix code. A fixed-length word is detected when the codeword length on the lead 211 and the code value on the lead 121 match one of the bit patterns stored in the respective codeword length and sub_fix code tables. For example, if one of the bit patterns of a sub_fix code in the sub_fix code table is "01", its 3-bit table entry will be "X01", where "X" represents a "don't care". If the code value on the lead 121 has a pattern "101", then a match occurs on the last two bits. As is described above, when the codeword length on the lead 211 and the code value on the lead 121 match entries in the codeword length and sub_fix code tables, respectively, the corresponding entry in the decoded word table is activated. The decoded word table outputs on a lead 213 the fixed-length word corresponding to the matched sub_fix code and the codeword length in the respective sub_fix code and codeword length tables.

In the meantime, the codeword length on the lead 211 is supplied to the accumulation block 500 which serves to accumulate the decoded codeword lengths and to generate the window control signal onto the lead 319, which represents the accumulated codeword length and is used to control the first barrel shifter 103. The accumulation block 500 comprises a summing block 300 and a latching block 400, wherein the summing block 300 includes two latch circuits 301 and 302, two adders 303 and 304, and a MUX 305, and the latching block 400 includes an accumulator latch 401 and a latch circuit 402. In the preferred embodiment of the invention, the latch circuit 301 and 302 operate at a different type of the clock tick from each other; the accumulator latch 401 operates at the same type of the clock tick as the latch circuit 301; and the latch circuit 402 carries out its operation at the same type of the clock tick as the latch circuit 302. Therefore, e.g., at each falling clock tick, at the adder 303, the codeword length on the lead 311 latched in the latch circuit 301 is added to the previously accumulated modulo 16 word lengths on the lead 413 from the accumulator latch 401 and the added codeword length of 5-bits is provided to the MUX 305 over a lead 315, while at each rising clock tick, at the adder 304, the codeword length on the lead 313 latched in the latch circuit 302 is added to the previously accumulated codeword lengths on a lead 415 latched in the latch circuit 402 and the added codeword length of 5-bits is provided to the MUX 305 over a lead 317. At the MUX 305, in turn, the added codeword length of 5-bits is outputted as a window control signal on the lead 319. The 5-bits of the window control signal on the lead 319 is latched in the accumulator latch 401 at each falling clock tick and in the latch circuit 402 at each rising clock tick. The accumulator latch 401, which receives the accumulated codeword length, provides, at each falling clock tick, the most significant bit(MSB) of the received data onto the lead 411 as the READ signal and provides the other 4-bits of the data to the adder 303 over a lead 413 as the previously accumulated modulo 16 word length. The window control signal indicating the new accumulated codeword length is also provided to the first barrel shifter 103 to control the position of the slidable output window thereof. The most significant bit(MSB) of the 5-bit window control signal is supplied to the latch circuits 101 and 102 as the CARRY signal through the lead 321 at each rising and falling clock tick. When the accumulated codeword lengths are greater than or equal to "16", the MSB of the window control signal is "1" and a CARRY signal appears on the lead 321. At the next falling clock tick, this MSB "1" bit appears as a Read signal on the lead 411 at the output of the accumulator latch 401. The buffer 50, in response to this READ signal, retrieves the next data segment and outputs it onto the lead 111. In response to the CARRY signal, the data segment on the lead 111 is brought into the latch circuit 101, and the contents of the latch circuit 101 is transferred into the latch circuit 102.

Figure 2:
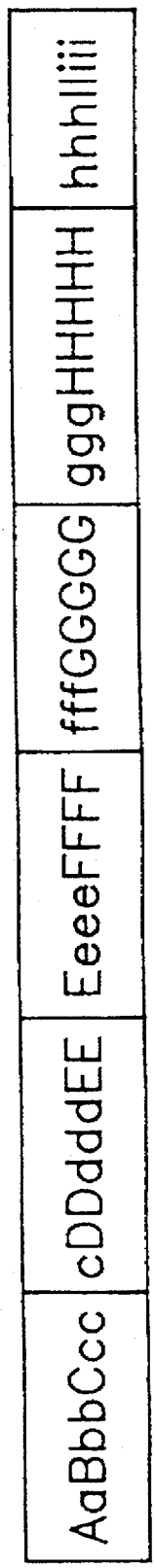
FIG. 2 depicts the input bit stream used for explaining the operation for the VLC decoding apparatus shown in FIG. 1.

The operation of the decoder in FIG. 1 may be more readily understood with reference to an example shown in tabular form in FIGS. 2 and 3. It is assumed that the data stream inputted from the data channel 51 to the input buffer memory 50 shown in FIG. 1 consists of the bit stream "AaBbbCcc cDDdddEE EeeeFFFF fffGGGGG gggHH- HHH hhhIIiii . . . ", as shown in FIG. 2, wherein "Aa" represents two bits in the first variable-length codeword, "A" and "a" being a respective pre_fix code and a sub_fix code of the first variable-length codeword; "Bbb" represents the three bits in the second variable-length codeword, "B" and "b" being a respective pre_fix code and a sub_fix code of the second variable-length codeword, etc.

Referring to FIG. 3, prior to the first clock tick of the falling edge, the 16-bit latch circuits 101 and 102 are initialized with a binary number "11111111 11111111", the output of the relay circuit 105 is initialized with "11111111", and the accumulation block 500 is initialized so that both the CARRY signal and the READ signal is "1". Specifically, at the clock tick of the falling edge twice prior to the first clock tick, the initialized output of the first look-up table 201 on the lead 211 is "8", so that the second barrel shifter 104 has an initial shift of "8". The accumulator latch 401 is initialized with a binary number "11000", and, thus the READ signal is "1" and the accumulated modulo 16 word length is 8. Since the latch circuit 402 is also initialized with "11000", the accumulated codeword length is "16". The window control signal indicating the newly accumulated codeword length on the lead 319 is "16" since the codeword length latched in the latch circuit 301 is the initialized value "8" and the accumulated modulo 16 word length is "8". At the clock tick of the rising edge prior to the first clock tick, the output of the first look-up table 201 on the lead 211, the accumulator latch 401, the latch circuits 301 and 402 retain their initial values, while the window control signal becomes "24" by adding the initialized codeword length "8" latched in the latch circuit 302 to the previously accumulated codeword length "16" from the latch circuit 402. With the READ signal being "1", the first data segment consisting of the 16-bits of "AaBbbCcc cDDdddEE" is retrieved from the input buffer memory 50 onto a lead 111. At this time, the outputs of the latch circuits 101 and 102, the outputs of the barrel shifters 103 and 104 are initialized values, represented in FIG. 3 with "11111111 11111111" and "11111111", and the output of the second look-up table 202 is a noise value represented in FIG. 3 with an "X".

At the first clock tick of the falling edge, since the previous CARRY signal was "1", the data segment of "AaBbbCcc cDDdddEE" on the lead 111 is latched in the latch circuit 101. The window control signal becomes "16" by adding the codeword length "8" latched in the latch circuit 301 to the previously accumulated modulo 16 word length "8" from the accumulator latch 401. Since the window control signal on the lead 319 is "16", the CARRY signal remains "1", and the first barrel shifter 103 outputs a sequence of the 17th–24th bits, i.e., "AaBbbCcc", in the 48-bits data segments, i.e., "11111111 1111111 AaBbbCcc cDDdddEE AaBbbCcc cDDdddEE", inputted thereto, to the second barrel shifter 104 over the lead 117. The output sequence from the relay circuit 105 has its initialized value and the codeword length output of the first look-up table 201 remains initialized "8", so that the second barrel shifter 104 outputs a sequence of the 9th–16th bits, i.e., "AaBbbCcc", in its two input data segments, i.e., "11111111 AaBbbCcc" to the relay circuit 105 through the lead 119 and simultaneously produces the 6th–8th bits, i.e., "111", from "11111111 AaBbbCcc" to the second look-up table 202, over the lead 121, as the code value. The latch circuit 102 contains its initialized value, and the decoded word of the second look-up table 202 contains noise value.

At the second clock tick of the rising edge, the READ signal remains at "1", wherein a next data segment of "EeeeFFFF fffGGGGG" is outputted from the input buffer memory 50 onto the lead 111. The window control signal becomes "24" by adding the codeword length "8" latched in the latch circuit 302 to the previously accumulated codeword length "16" latched in the latch circuit 402. Since the window control signal on the lead 319 is "24", the CARRY signal remains "1" and the first barrel shifter 103 outputs the sequence of "cDDdddEE" from the data segments of "11111111 11111111 AaBbbCcc cDDdddEE EeeeFFFF fffGGGGG" inputted thereto, to the second barrel shifter 104. The sequence of "AaBbbCcc" previously held in the relay circuit 105 at the first falling clock tick, is supplied over the lead 127 as the decoding output sequence to the first look-up table 201, and to the second barrel shifter 104. The first look-up table 201 recognizes the first one bit, i.e., "A" in the decoding output sequence of "AaBbbCcc" and outputs the decoded codeword length, e.g., "2" corresponding to the recognized pre_fix code entry therein onto the lead 211. The decoded codeword length, "2", on the lead 211 is then coupled to the second look-up table 202 and to the second barrel shifter 104 which outputs the 3rd–10th bits, i.e., "BbbCcccD", in the input data segments of "AaBbbCcc cDDdddEE" to the relay circuit 105 over the lead 119 and transfers 3-bit sequence of "1Aa" as the code value to the second look-up table 202 over the lead 121. The second look-up table 202 recognizes the decoded codeword length, "2", and the code value, "1Aa", and outputs the fixed-length decoded word, e.g., "A'" corresponding to the recognized codeword length and sub_fix code entries therein, onto the lead 213.

At the third clock tick of the falling edge, since the previous CARRY signal was "1", the data segment of "EeeeFFFF fffGGGGG" on the lead 111 is latched in the latch circuit 1011; and the data segment of "AaBbbCcc cDDdddEE" previously held in the latch circuit 101 is latched in the latch circuit 102. The window control signal becomes "10" by adding the previously decoded codeword length "2" to the previously accumulated modulo 16 word length "8". Since the window control signal on the lead 319 is "10", the CARRY signal becomes "0", and the first barrel shifter 103 outputs the sequence of "DdddEEEe" from the data segments of "AaBbbCcc cDDdddEE EeeeFFFF fffGGGGG EeeeFFFF fffGGGGG" to the second barrel shifter 104. The output sequence of "BbbCcccD" previously held in the relay circuit 105 at the second rising clock tick is provided to the first look-up table 201 and the second barrel shifter. 104. The first look-up table 201 recognizes the first one bit, i.e., "B" in the decoding output sequence of "BbbCcccD" and outputs the decoded codeword length, e.g., "3" corresponding to the recognized pre_fix code entry therein onto the lead 211. The decoded codeword length, "3", oil the lead 211 is then coupled to the second look-up table 202 and to the second barrel shifter 104 which outputs the sequence of "CcccDDdd" in the "BbbCccD DdddEEEe" and transfers 3-bit sequence of "Bbb" as the code value to the second look-up table 202. The second look-up table 202 recognizes the decoded codeword length, "3", and the code value, "Bbb", and outputs the fixed-length decoded word, e.g., "B'" corresponding to the recognized codeword length and sub_fix code entries therein, onto the lead 213.

At the fourth clock tick of the rising edge, the READ signal remains "1", wherein a next data segment of "gggH-HHHH hhhIIiii" is outputted from the input buffer memory 50 onto the lead 111. The window control signal becomes "13" by adding the previous decoded codeword length "3" to the previously accumulated codeword length "10". Since the window control signal on the lead 319 is "13", the CARRY signal remains "0", and the first barrel shifter 103 outputs the sequence of "dEEEeeeF" from "AaBbbCcc cDDdddEE EeeeFFFF fffGGGGG gggHHHHH hhhIIiii" to the second barrel shifter 104. The output sequence of "CcccDDdd" previously held in the relay circuit 105 at the third falling clock tick is coupled to the first look-up table 201 and the second barrel shifter 104. The first look-up table 201 recognizes the first one bit, i.e., "C" in the decoding output sequence of "CcccDDdd" and outputs the decoded codeword length, e.g., "4" corresponding to the recognized pre_fix code entry therein onto the lead 211. The decoded codeword length, "4", on the lead 211 is then coupled to the second look-up table 202 and to the second barrel shifter 104 which outputs the 8-bit sequence of "DDdddEEE" in the "CcccDDdd dEEEeeeF" to the relay circuit 105 and transfers 3-bit sequence of "ccc" as the code value to the second look-up table 202. The second look-up table 202 recognizes the decoded codeword length, "4", and the code value, "ccc", and outputs the fixed-length decoded word, e.g., "C" corresponding to the recognized codeword length and sub_fix code entries therein, onto the lead 213.

At the fifth clock tick of the falling edge, since the previous CARRY signal was "0", the READ signal becomes "0" and the three data segments input to the first barrel shifter 103 remains unchanged. The window control signal becomes "17" by adding the previous decoded codeword length "4" to the previously accumulated modulo 16 word length "13". Since the window control signal on the lead 319 is "17", the CARRY signal becomes "1", and the first barrel shifter 103 outputs the sequence of "eeeFFFFf" from "AaBbbCcc cDDdddEE EeeeFFFF fffGGGGG gggHH-HHH hhhIIiii" to the second barrel shifter 104. The output sequence of "DDdddEEE" previously held in the relay circuit 105 at the fourth rising clock tick is fed to the first look-up table 201 and the second barrel shifter 104. The first look-up table 201 recognizes the first two bits, i.e., "DD" in the decoding output sequence of "DDdddEEE" and outputs the decoded codeword length, e.g., "5" corresponding to the recognized pre_fix code entry therein onto the lead 211. The decoded codeword length, "5", on the lead 211 is then coupled to the second look-up table 202 and to the second barrel shifter 104 which outputs the sequence of "EEEee-eFF" from the "DDdddEEE eeeFFFFF" to the relay circuit 105 and transfers 3-bit sequence of "ddd" as the code value to the second look-up table 202. The second look-up table 202 recognizes the decoded codeword length, "5", and the code value, "ddd", and outputs the fixed-length decoded word, e.g., "D'" corresponding to the recognized codeword length and sub_fix code entries therein, onto the lead 213.

At the sixth clock tick of the rising edge, the READ signal remains "0", wherein the three data segments input to the first barrel shifter 103 remains unchanged. The window control signal becomes "22" by adding the previous decoded codeword length "5" to the previously accumulated codeword length "17". Since the window control signal on the lead 319 is "22", the CARRY signal remains "1", and the first barrel shifter 103 outputs the sequence of "FFfffGGG" from "AaBbbCcc cDDdddEE EeeeFFFF fffGGGGG gggH-HHHH hhhIIiii" to the second barrel shifter 104. The output sequence of "EEEeeeFF" previously held in the relay circuit 105 at the fifth falling clock tick is supplied to the first look-up table 201 and the second barrel shifter 104. The first look-up table 201 recognizes the first three bits, i.e., "EEE" in the decoding output sequence of "EEEeeeFF" and outputs the decoded codeword length, e.g., "6" corresponding to the recognized pre_fix code entry therein onto the lead 211. The decoded codeword length, "6", on the lead 211 is then coupled to the second look-up table 202 and to the second barrel shifter 104 which outputs the 8-bit sequence of "FFFFfffG" from "EEEeeeFF FFfffGGG" to the relay circuit 105 and transfers 3-bit sequence of "eee" as the code value to the second look-up table 202. The second look-up table 202 recognizes the decoded codeword length, "6", and the code value, "eee", and outputs the fixed-length decoded word, e.g., "E'" corresponding to the recognized codeword length and sub_fix code entries therein, onto the lead 213.

At the seventh clock tick of the falling edge, since the previous CARRY signal was "1", the data segment of "gggHHHHH hhhIIiii" on the lead 111 is latched in the latch circuit 101; and the data segment of "EeeeFFFF fffGGGGG" previously held in the latch circuit 101 is latched into the latch circuit 102. The window control signal becomes "12" by adding the previous decoded codeword length "6" to the previously accumulated modulo 16 word length "6". Since the window control signal on the lead 319 is "12", the CARRY signal becomes "0", and the first barrel shifter 103 outputs the sequence of "GGGGgggH" of from "EeeeFFFF fffGGGGG gggHHHHH hhhIIiii gggHHHHH hhhIIiii" to the second barrel shifter 104. The output sequence of "FFFFfffG" previously held in the relay circuit 105 at the sixth rising clock tick is applied to the first look-up table 201 and the second barrel shifter 104. The first look-up table 201 recognizes the first four bits, i.e., "FFFF" in the decoding output sequence of "FFFFfffG" and outputs the decoded codeword length, e.g., "7" corresponding to the recognized pre_fix code entry therein onto the lead 211. The decoded codeword length, "7", on the lead 211 is then coupled to the second look-up table 202 and to the second barrel shifter 104 which outputs the sequence of "GGGGGggg" from "FFFFfffG GGGGgggH" to the relay circuit 105 and transfers 3-bit sequence of "fff" as the code value to the second look-up table 202. The second look-up table 202 recognizes the decoded codeword length, "7", and the code value, "fff", and outputs the fixed-length decoded word, e.g., "F" corresponding to the recognized codeword length and sub_fix code entries therein, onto the lead 213.

As may be seen from the above, it should be readily appreciated that the VLC decoding apparatus of the present invention carries out a decoding operation at each clock tick of the clock signal thereby advantageously achieving a high speed decoding operation.

While the present invention has been described with respect to the particular embodiments, it will be apparent to those skilled in the art that various changes and modifications may be made without departing from the scope of the invention as defined in the following claim.

What is claimed is:

1. A variable-length code decoding apparatus for decoding, at a half clock rate, sequential variable-length codewords supplied from an input buffer which stores an input bit stream to be decoded in fixed-length segments having a length equal to twice a longest length of the variable-length codewords, said apparatus comprising:

first and second bit storage means for storing consecutive fixed-length segments of the input bit stream in the input buffer;

first shift means connected to the first and the second bit storage means and having a first output window for producing a first window output sequence from bits in the consecutive fixed-length segments from the first and the second bit storage means, the bit length of the first window output sequence being equal to the longest length of the variable-length codewords and the first output window being shifted across the bits in the first and the second bit storage means in direct response to a window control signal;

second shift means connected to the first shift means and having a second output window for producing a second window output sequence from bits contained in the first window output sequence and a previous decoding output sequence applied thereto, and generating high-order M bits from the first bit in the second window output sequence as a code value, the bit length of the second window output sequence being equal to the longest length of the variable-length codewords, said second output window being shifted in direct response to a codeword length and M being an integer smaller than the longest length of the variable-length codewords;

relay means for latching the second window output sequence for one-half the clock cycle and producing the latched second window output sequence as the decoding output sequence;

first memory means coupled to the relay means for producing a codeword length in response to a pre_fix code which consists of high-order P bits of the variable-length codeword that begins at the first bit position of the decoding output sequence, the maximum value of P being an integer smaller than the longest length of the variable-length codewords;

second memory means connected to the first memory means and the second shift means for producing a fixed-length word in response to the codeword length and the code value; and accumulation means for adding the codeword length to a previously accumulated codeword length in order to produce the window control signal indicating the added and accumulated codeword length, said accumulation means generating a read signal to retrieve a next fixed-length segment stored in the input buffer when the accumulated codeword length is greater than twice the longest length of the variable-length codewords, the next fixed-length segment being stored in the first bit storage means and the fixed-length segment previously stored in the first bit storage means being transferred to the second bit storage means.

* * * * *

UNITED STATES PATENT AND TRADEMARK OFFICE
CERTIFICATE OF CORRECTION

PATENT NO. : 5,708,430
DATED : Jan. 13, 1998
INVENTOR(S) : Young-Seok Sohn

It is certified that error appears in the above-identified patent and that said Letters Patent is hereby corrected as shown below:

On title page, item [73] should read as follows:

Assignee: Daewoo Electronics Co., Ltd., Seoul, Rep. of Korea

Signed and Sealed this

Twenty-first Day of April, 1998

*Attest:*

BRUCE LEHMAN

*Attesting Officer*     *Commissioner of Patents and Trademarks*